US00RE41889E

(19) United States
(12) Reissued Patent
Ferrari et al.

(10) Patent Number: US RE41,889 E
(45) Date of Reissued Patent: Oct. 26, 2010

(54) PROCESS FOR MANUFACTURING HIGH-SENSITIVITY ACCELEROMETRIC AND GYROSCOPIC INTEGRATED SENSORS, AND SENSOR THUS PRODUCED

(75) Inventors: Paolo Ferrari, Gallarate (IT); Benedetto Vigna, Potenza (IT); Pietro Montanini, Phoenix, AZ (US); Marco Ferrera, Domodossola (IT)

(73) Assignee: STMicroelectronics S.r.l., Agrate (Brianza) (IT)

(21) Appl. No.: 10/360,367

(22) Filed: Feb. 5, 2003

Related U.S. Patent Documents

Reissue of:
(64) Patent No.: 6,184,051
Issued: Feb. 6, 2001
Appl. No.: 09/479,189
Filed: Jan. 7, 2000

U.S. Applications:

(62) Division of application No. 09/126,625, filed on Jul. 30, 1998, now Pat. No. 6,109,106.

(30) Foreign Application Priority Data

Jul. 31, 1997 (EP) ..... 97830407

(51) Int. Cl.
*H01L 21/00* (2006.01)

(52) U.S. Cl. ..... 438/48; 438/52; 438/53; 257/414; 257/E21.613

(58) Field of Classification Search ..... 438/50, 438/52, 53, 48, 619; 216/21, 2, 11; 257/414–420, 257/E21.613
See application file for complete search history.

(56) References Cited

U.S. PATENT DOCUMENTS 4,699,006 A 10/1987 Boxenhorn ..... 73/517
4,783,237 A 11/1988 Aine et al. ..... 437/15
5,016,072 A 5/1991 Greiff ..... 357/26
5,395,802 A * 3/1995 Kiyota et al. ..... 438/52
5,417,111 A 5/1995 Sherman et al. ..... 73/517
5,591,910 A 1/1997 Lin ..... 73/514.38
5,616,514 A 4/1997 Muchow et al. ..... 438/50
5,747,353 A * 5/1998 Bashir et al. ..... 438/50
5,830,777 A * 11/1998 Ishida et al. ..... 438/50
6,020,215 A * 2/2000 Yagi et al. ..... 438/52
6,090,638 A 7/2000 Vigna et al. ..... 438/50
6,133,059 A * 10/2000 Werner ..... 438/52
6,199,874 B1 * 3/2001 Galvin et al. ..... 280/5.514

FOREIGN PATENT DOCUMENTS

DE 43 18 466 A1 12/1994

OTHER PUBLICATIONS

Kuehnel, Wolfgang et al., "A Surface Micromachined Silicon Accelerometer With On–Chip Detection Circuitry," *Elsevier Science Sensors and Actuators,* vol. 45, pp. 7–16, 1994.

Gabrielson, Thomas B., "Mechanical–Thermal Noise in Micromachined Acoustic and Vibration Sensors," *IEEE Transactions on Electron Devices,* vol. 40, No. 5, pp. 903–909, May 1993.

* cited by examiner

*Primary Examiner*—Quoc D Hoang
(74) *Attorney, Agent, or Firm*—David V. Carlson; Lisa K. Jorgenson

(57) ABSTRACT

A movable mass forming a seismic mass is formed starting from an epitaxial layer and is covered by a weighting region of tungsten which has high density. To manufacture the mass, buried conductive regions are formed in the substrate. Then, at the same time, a sacrificial region is formed in the zone where the movable mass is to be formed and oxide insulating regions are formed on the buried conductive regions so as to partially cover them. An epitaxial layer is then grown, using a nucleus region. A tungsten layer is deposited and defined and, using a silicon carbide layer as mask, the suspended structure is defined. Finally, the sacrificial region is removed, forming an air gap.

20 Claims, 5 Drawing Sheets

PROCESS FOR MANUFACTURING HIGH-SENSITIVITY ACCELEROMETRIC AND GYROSCOPIC INTEGRATED SENSORS, AND SENSOR THUS PRODUCED

Matter enclosed in heavy brackets [ ] appears in the original patent but forms no part of this reissue specification; matter printed in italics indicates the additions made by reissue.

CROSS-REFERENCE TO RELATED APPLICATION

This application is a divisional of pending U.S. patent application Ser. No. 09/126,625, filed Jul. 30, 1998.

TECHNICAL FIELD

The invention relates to a process for manufacturing high-sensitivity accelerometric and gyroscopic integrated sensors and a sensor thus produced.

BACKGROUND OF THE INVENTION

As is known, using electromechanical microstructures of semiconductor material, the manufacture of which utilizes microelectronics techniques, has recently been proposed for producing accelerometers and gyroscopes. These silicon micro-machining techniques make it possible to produce different types of angular velocity and acceleration sensors. In particular, at the present lime prototypes operating according to the piezoelectric, piezoresistive, capacitive, threshold, resonant and tunnel effect principles have been proposed.

Reference will be made below to an accelerometric sensor of differential capacitive type, i.e. one in which acceleration induces the movement of a seismic mass which constitutes the electrode common to two coupled capacitors by varying the two capacitances in opposite directions. This effect is known as differential variation of capacitance.

Historically, integrated micro-structures have been manufactured by preferably using the "bulk micro-machining" technique in which a wafer of single-crystal silicon is machined on both faces. This technique is, however, incompatible with the process steps for producing components of a circuit which processes a signal picked up by a sensitive element, as required at present.

It has been proposed to use the technique of "surface micro-machining" in which the sensitive element is made of multi-crystal silicon and suspended structures are formed by depositing and successively removing sacrificial layers. This technique is compatible with the current integrated circuit manufacturing processes and is therefore preferred at present. The integrated micro-structures produced with this technique are, however, relatively insensitive to acceleration and angular velocity. In fact, having a mass of the order of a few tenths of a microgram, they suffer the effects of thermodynamic noise caused by the Brownian movement of the particles of the fluid in which they are immersed (see, for example, the article by T. B. Gabrielson entitled "Mechanical-Thermal Noise in Micromachined Acoustic and Vibration Sensors", IEEE Transactions on Electron Devices, vol. 40, No. 5, May 1993). The upper limit to the mass obtainable with these structures is imposed by genuinely technological reasons; the deposition of very thick films involves extremely long wafer machining times and renders the surface of the wafer unsuitable for the successive operations such as lapping the wafers.

A technique for machining the epitaxial layer (epitaxial micro-machining) is also known, which produces microstructures with inertial masses that are higher and hence more sensitive, but not yet at a sufficient value for practical applications.

SUMMARY OF THE INVENTION

An object of the invention is to improve a process for manufacturing an accelerometric and gyroscopic sensor according to a technique of "epitaxial micro-machining" so as to increase its sensitivity further than the prior art.

An embodiment of the invention provides a process for manufacturing a high-sensitivity accelerometric and gyroscopic integrated sensor including forming a sacrificial region on a substrate of semiconductor material, growing an epitaxial layer that includes tungsten on the substrate and the sacrificial region, and then removing selective portions of the epitaxial layer and the sacrificial region to form a movable mass. The moveable mass formed is surrounded at the sides and separated from fixed regions by trenches, and separated from the substrate by an air gap.

It also provides for an accelerometric integrated sensor, having a substrate and an epitaxial layer of semiconductor material, whereby the epitaxial layer includes tungsten and forms a movable mass which is surrounded at sides by a fixed mass. The movable mass is separated from the substrate by a gap from below and from the fixed mass by trenches at the sides, and is supported by the fixed mass through anchorage portions.

BRIEF DESCRIPTION OF THE DRAWINGS

For an understanding of the invention, a number of preferred embodiments will now be described, purely by way of non-exhaustive example, with reference to the accompanying drawings.

DETAILED DESCRIPTION

An embodiment of a capacitive-type accelerometric or gyroscopic sensor according to a first embodiment of the process will now be described with reference to FIGS. 1–10, in which the thicknesses of the various layers of material are not to scale and some layers are not shown in all the illustrations for reasons of representation.

Figure 1:
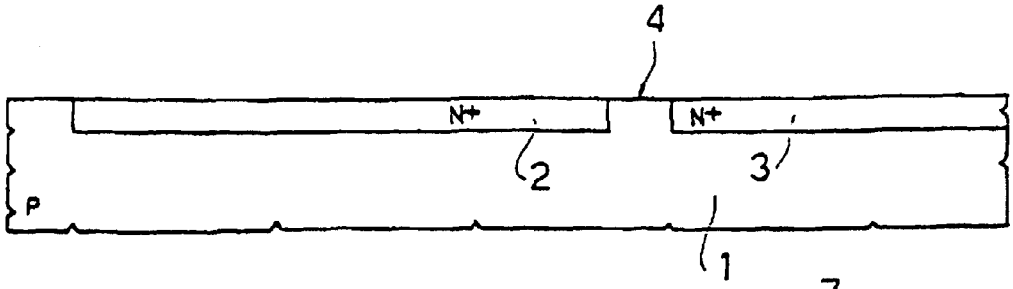
FIGS. 1–8 show cross sectional views at different points of a semiconductor wafer during successive steps of the manufacturing process according to the invention.
Figure 2:
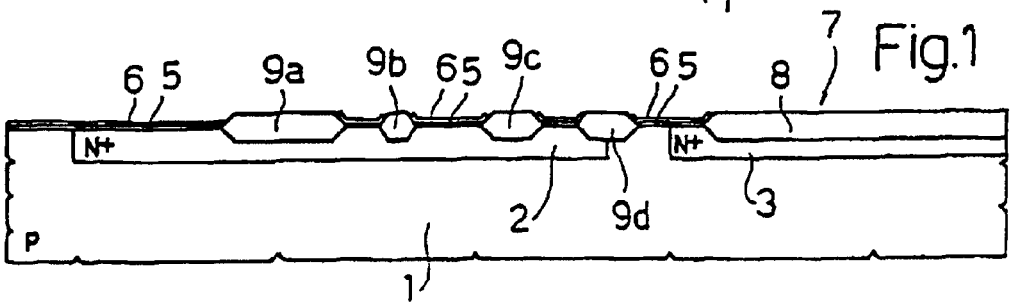

Shown in FIG. 1, buried $N^+$-type conductive regions 2, 3 to form buried interconnections are formed in a substrate 1 of single-crystal silicon of P-type conductivity, using conventional masking and implantation techniques. A pad oxide layer 5 is formed, e.g., grown thermally, on a surface 4 of the substrate 1, and a silicon nitride layer 6 is deposited on it. The silicon nitride layer 6 is then defined and removed selectively in a sensor zone 7. Then the portions of the surface of the substrate 1 not covered by the layer 6 are locally oxidated, forming oxide regions comprising a sacrificial region 8 (surrounded at the sides and underneath by the buried conductive region 3) and buried oxide regions 9a, 9b, 9c and 9d at the buried conductive region 2, obtaining the structure of FIG. 2.

Figure 3:
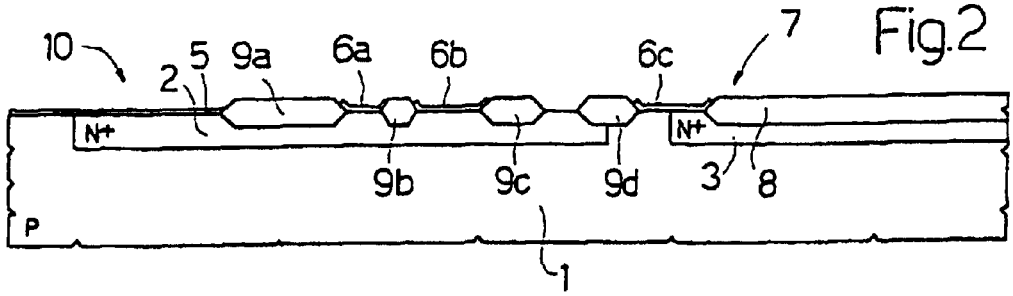

Through suitable masking steps, portions of the layers 5, 6 are then removed in the sensor zone 7 where the buried contacts of the sensor and of the silicon nitride layer 6 are to be formed in the circuitry and from an interconnection area 10, obtaining the structure of FIG. 3. In FIG. 3, the pad oxide layer 5 underneath the silicon nitride layer 6 is not shown and 6a, 6b and 6c denote the portions of nitride included, respectively, between the buried oxide regions 9a and 9b; 9b and 9c and the regions 9d and 8.

Figure 4:
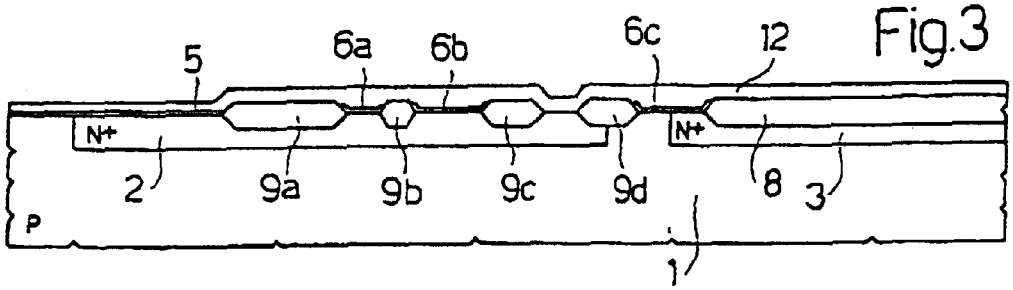
Figure 5:
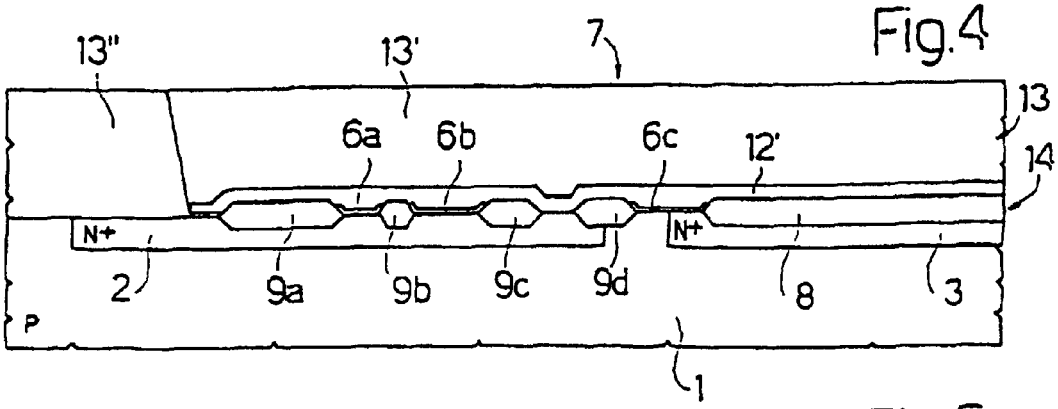

An amorphous or multi-crystal silicon layer 12 is then deposited, as shown in FIG. 4. By means of a phototechnique and plasma etching step, the amorphous or multi-crystal silicon layer 12 is removed, except in the sensor zone 7, forming a silicon region 12' representing the nucleus for a successive epitaxial growth step. By means of chemical etching, the pad oxide layer 5 is then removed where exposed and epitaxial growth takes place with formation of a "pseudo-epitaxial", P-type layer 13. In the sensor zone 7, the layer 13 has a multi-crystal structure (multi-crystal region 13') and a single-crystal structure elsewhere (single-crystal region 13"). A wafer 14 as shown in FIG. 5 is thus obtained.

Figure 6:
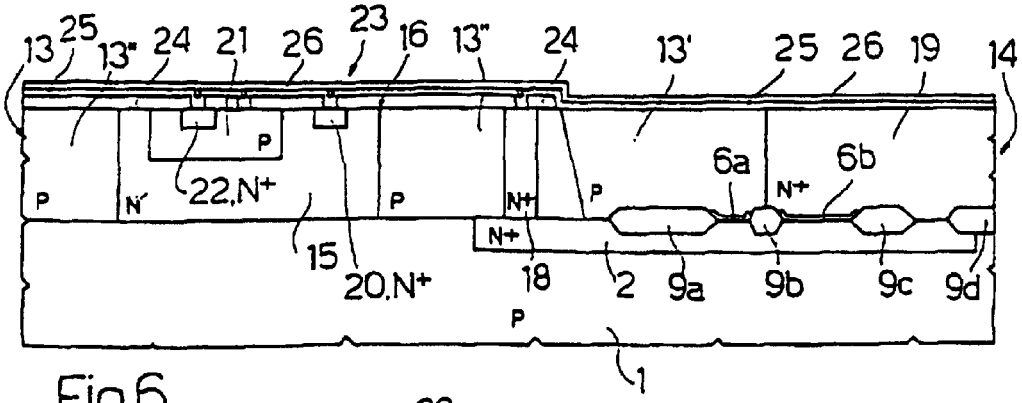

The pseudo-epitaxial layer 13 is then doped with doping ions suitable for determining an N-type conductivity to form deep regions. In particular, as shown in FIG. 6, in which a portion of the wafer 14 is shown slightly displaced to the left with respect to FIGS. 1–5, a deep $N^+$-type region 18 is formed in the single-crystal region 13" and extends from a surface 16 as far as the buried conductive region 2. This deep region 18 electrically connects the buried conductive region 2 to the surface 16. Also formed in the multi-crystal region 13' is an $N^+$-type well 19 that extends from the surface 16 as far as the buried conductive region 3 (see FIG. 7) and, partially, the buried conductive region 2. In particular, the well 19 extends above the buried oxide regions 9c, 9d and half of the buried oxide region 9b, electrically contacting the buried conductive region 2 in the area included between the buried oxide regions 9c and 9d that are not covered by the portions of nitride 6a–6c.

The electronic components of the circuitry are then formed by means of standard steps. In the example shown, an N-type collector well 15 is formed, extending from the surface 16 of the pseudo-epitaxial layer 13 as far as the substrate 1. An NPN transistor 23, having an $N^+$-type collector contact region 20, a P-type base region 21 and an $N^+$-type emitter region 22 is formed in the collector well 15.

A dielectric layer 24 for opening the contacts, e.g., BPSG (boron phosphorus silicon glass) is then deposited on the surface 16 of the wafer 14. Then, by a suitable masking and selective removal step, the contacts are opened in the circuitry area and on the deep region 18, and a part of the dielectric layer 24 is removed from the sensor zone 7. An adhesive layer 25 (of titanium nitride for example) is then deposited, to facilitate the adhesion of the next layer to the silicon of the wafer 14. A tungsten layer 26 is deposited by CVD (Chemical Vapor Deposition) at a thickness of 1 μm thick, for example, obtaining the intermediate structure of FIG. 6. The nucleus silicon region 12' has been omitted in FIG. 6.

Figure 7:
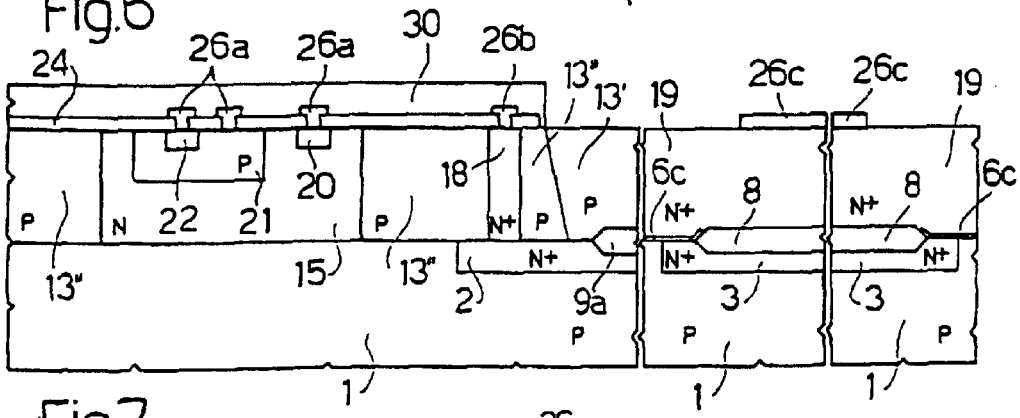

The tungsten layer 26 is then shaped, by means of known photo-lithographic steps, so as to form contacts 26a of the circuitry and 26b of the sensor and a weighting region 26c over the well 19, as shown in FIG. 7 in which the adhesive layer 25 is not shown. In particular, the weighting region 26c is shaped as partially shown in FIG. 10, i.e., corresponding to the shape of the movable electrode of the sensor, as explained in greater detail below. A dielectric passivation layer 30 is then deposited and this is removed in the zone of the contact pads (to permit the electrical contacting of the device, in a manner not shown), and in the sensor zone 7, thus obtaining the structure of FIG. 7.

Figure 8:
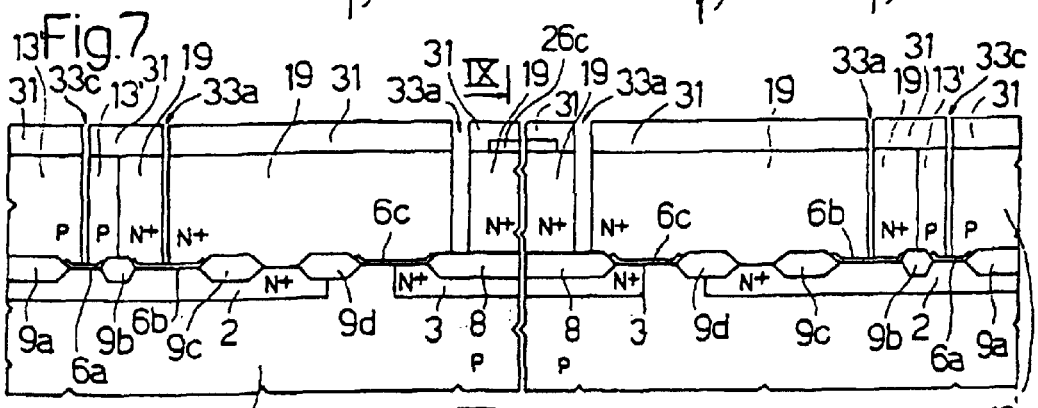
Figure 9:
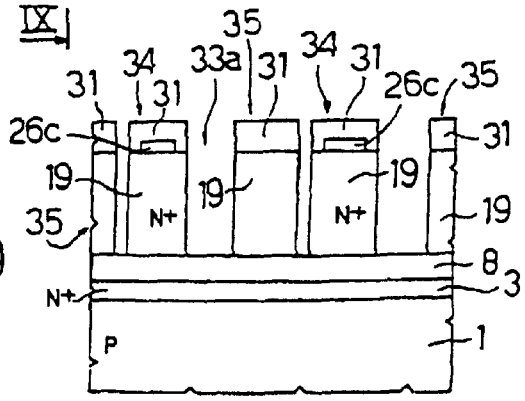
FIG. 9 shows a cross sectional view of a plane perpendicular to FIG. 8.

A silicon carbide layer 31, intended to form a mask for the subsequent step of excavation of the pseudo-epitaxial layer 13 and precisely of the multi-crystal region 13', is then deposited and defined. Excavations are carried out to release the movable mass of the accelerometer, to separate the fixed and movable electrodes and to insulate the regions at different potential. Thus a trench 33a which separates the fixed part from the movable part and the fixed mass from the surrounding portion of the well 19 is formed. A trench 33b (see FIGS. 10 and 11) separating the anchorage regions from the surrounding portion of the well 19 and a trench 33c separating the sensor from the rest of the chip are also formed. The structure is thus obtained which is shown in FIG. 8, taken on the same section as FIGS. 1–7 but centred on the sensor zone 7, and in FIG. 9, taken perpendicular to that of FIG. 8. FIG. 9 shows transverse walls 34 and 35 defining the movable electrodes and the fixed electrodes of the sensor, as explained in greater detail below with reference to FIGS. 10 and 11.

Figure 10:
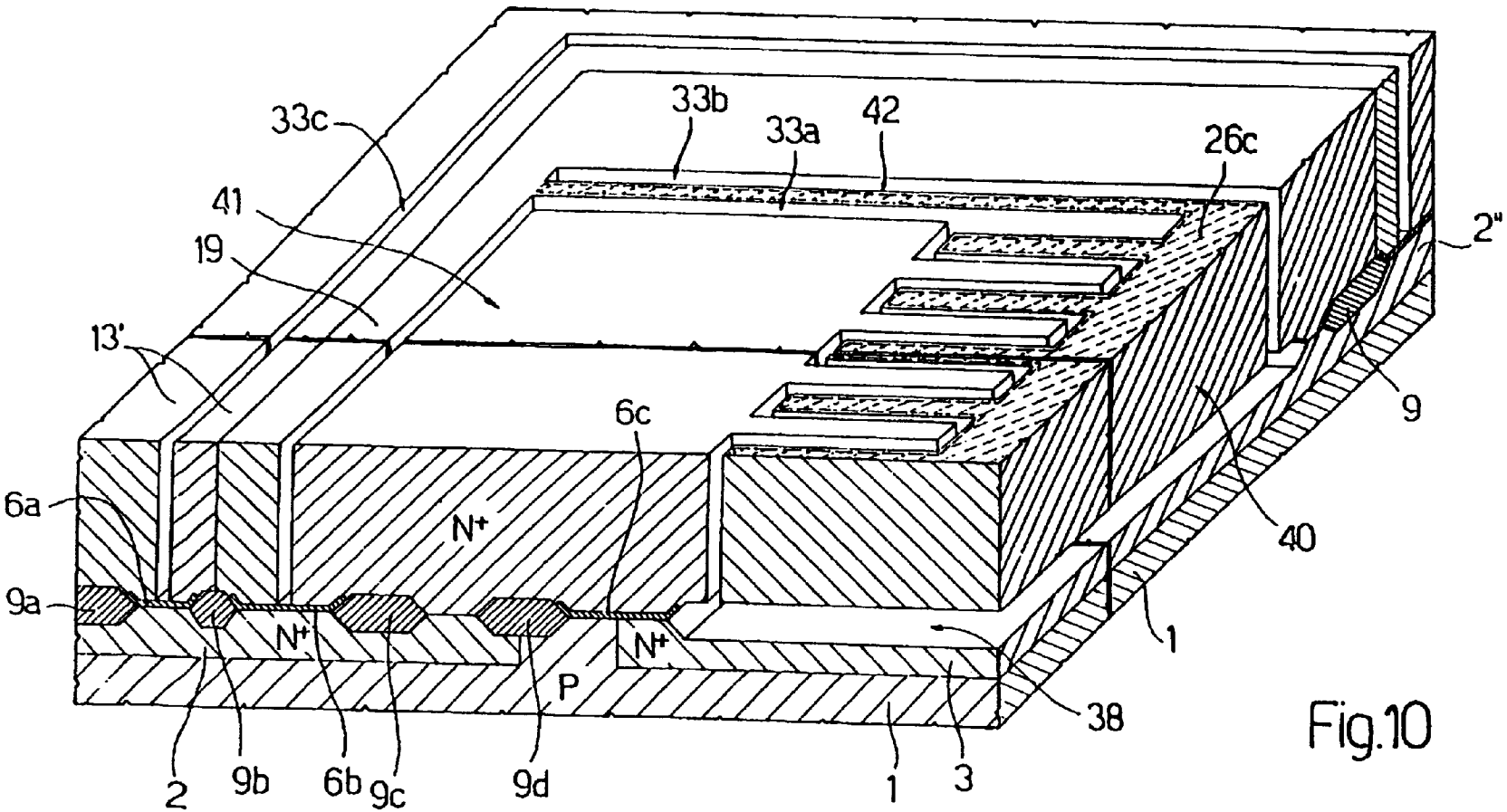
FIG. 10 shows a perspective view of the sensor obtained with the process of FIGS. 1–9.
Figure 11:
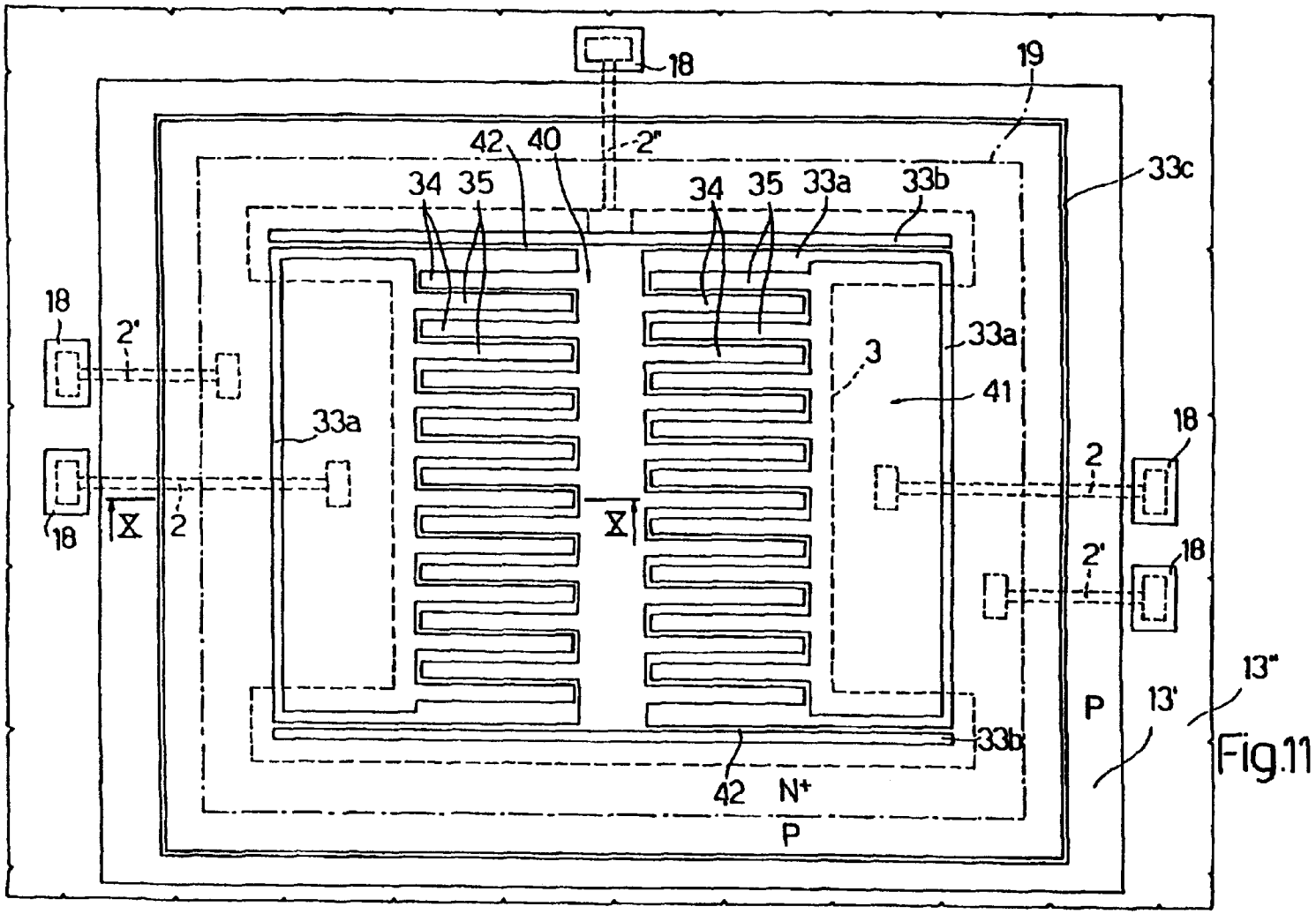
FIG. 11 shows a top view of the sensor of FIG. 10.

Finally, the sacrificial region 8 is removed by etching in, e.g., hydrofluoric acid, and the zone previously occupied by this region 8 forms an air gap 38 which at the bottom separates the movable mass from the rest of the wafer. The movable mass is then etched and supported by the chip only at the anchorage zones. With a subsequent etching in plasma, the silicon carbide layer 31 is removed from all areas of the wafer. The final structure is thus obtained which is shown in FIGS. 10 and 11 in which the movable mass is denoted by 40, the fixed mass by 41, and the anchorage zones of the movable mass by 42. In particular, FIG. 11 shows the outer edge of the buried conductive region 3 in broken lines and the outer edge of the well 19 in dot-and-dash lines. Broken lines also denote the buried conductive regions 2 for forming the buried connections of the fixed mass, and 2', 2" those of the movable mass, formed at the same time and in the same way as the buried conductive region 2. FIG. 10 also shows the profile of the weighting region 26c.

As will be noted, the movable mass 40 is H-shaped and the transverse walls 34 define the movable electrodes of the capacitive sensor. The moveable electrodes are interleaved in a comb-like manner with the transverse walls 35 defining the fixed electrodes and are separated from its central element. The structure is therefore equivalent to a capacitor formed by two capacitors in series, each formed by a plurality of elementary capacitors connected in parallel.

In per se known manner, through the deep regions 18 and the buried conductive regions 2, 2', 2", and 3, the movable electrodes 34 and the fixed electrodes 35 are biased at different voltages so that when the movable mass 40 is subjected to acceleration, the consequent change of distance between the movable electrodes and the fixed ones may be detected as a variation of capacitance.

Manufacturing the movable mass 40 in a semiconductor material having a tungsten weighting region 26c, as described, gives the sensor high sensitivity. In fact, tungsten has high density (19.3 g/cm3) with respect to multi-crystal or amorphous silicon (2.33 g/cm3). Consequently, a tungsten layer 1 μm thick is virtually equivalent, from the point of view of the mechanical properties, to a 10 μm polysilicon layer. On the other hand, the deposition by CVD of a tungsten layer of the indicated thickness can easily be achieved with the conventional integrated microelectronics machining techniques.

The sensor obtained in this way thus has high sensitivity, yet benefits from the advantages typical of epitaxial machining technology and permits the integration of the sensor together with the integrated signal processing circuit.

The manufacturing process is simple to implement, using steps typical of microelectronics and forms the metallic circuit interconnection regions and the weighting regions of the movable structure at the same time. The process is also readily controllable and repeatable.

Figure 12:
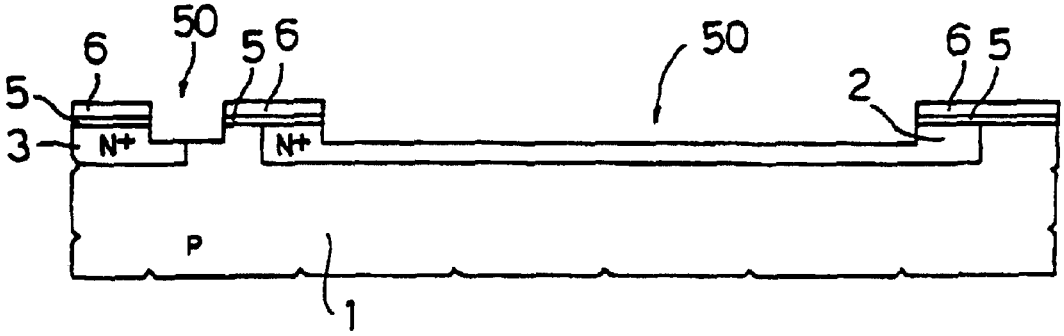
FIGS. 12 and 13 show transverse sections of a portion of a wafer in two successive manufacturing steps according to a different embodiment of the process.
Figure 13:
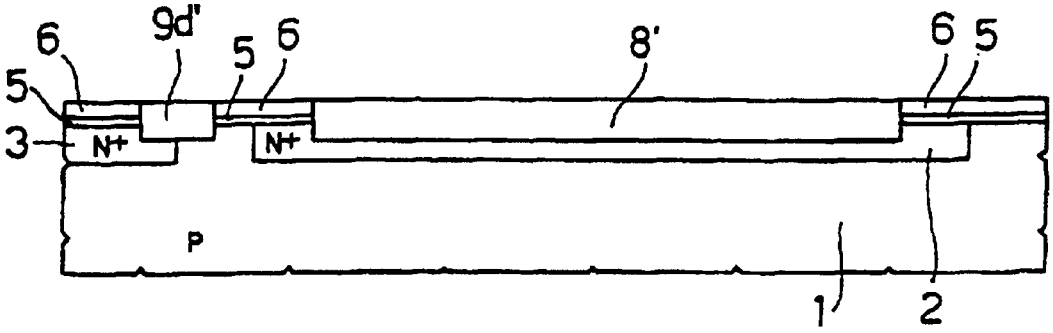

According to a different embodiment of the invention, the buried oxide regions 8 and 9 are grown in recesses previously formed in the substrate 1, after the buried conductive regions 2, 3 have been formed. In detail, shown in FIG. 12, starting from the structure of FIG. 1, the oxide 5 and nitride 6 layers are formed and defined in a similar manner to that described with reference to FIG. 2. The portions of substrate 1 not covered by the layers 5, 6 are then etched, forming recesses 50 (FIG. 12). The recesses 50 are then filled with thermally grown oxide regions, only the sacrificial region 8' and the buried oxide region 9d', shown in FIG. 13. The further steps described above then follow, starting from the removal of portions of nitride 6 and of oxide 5 where the contacts are to be formed and in the zone of the circuitry, as described from FIG. 3 onwards.

According to a further embodiment which is not shown, the sacrificial and buried oxide regions may be obtained by depositing and shaping an oxide layer.

Finally it will be clear that numerous modifications and variations may be introduced to the process and sensor described and illustrated herein, all coming within the scope of the inventive concept as defined in the accompanying claims. In particular, the components of the circuitry integrated with the sensor may be either bipolar or MOS; the conductivity of the conductive regions may be the opposite of that shown and the protective and/or adhesive materials may be replaced by others which are equivalent as regards the functions desired, as well as other changes and variations.

What is claimed is:

1. A process for manufacturing an accelerometric and gyroscopic integrated sensor, comprising the steps of:

forming a sacrificial region [on] *in* a substrate of semiconductor material;

growing an epitaxial layer on said substrate and said sacrificial region; [and]

removing selective portions of said epitaxial layer and said sacrificial region to form a movable mass surrounded at the sides and separated from fixed regions by trenches and separated from said substrate by an air gap*, the movable mass supported by anchorage zones only at the sides;* and forming a weighting region [of tungsten] at said movable mass.

2. The process according to claim 1, wherein said step of forming a weighting region comprises a step of depositing and defining a tungsten layer over said epitaxial layer *to have a shape corresponding to a shape of the movable mass*.

3. The process according to claim 2 wherein said step of depositing and defining a tungsten layer is carried out before said step of removing selective portions of said epitaxial layer.

4. The process according to claim 2 wherein after said step of depositing and defining said tungsten layer, a step of masking the epitaxial layer and said weighting regions through a protective layer resistant to etching of said sacrificial region is performed.

5. The process according to claim 4 wherein said sacrificial region is a silicon oxide and said protective layer comprises silicon carbide.

6. The process according to claim 2, comprising, before said step of depositing said tungsten layer, the steps of:

forming electronic components in said epitaxial layer;

depositing a dielectric layer over said electronic components; and forming contact openings in said dielectric layer, and wherein said step of defining said tungsten layer further comprises the step of forming tungsten contact electrodes for said electronic components and for said accelerometric and gyroscopic sensor.

7. The process according to claim 2 wherein before said step of depositing and defining a tungsten layer, a step of depositing an adhesive titanium nitride layer is performed.

8. The process according to claim 1 wherein a step of forming a nucleus region of non-single-crystal semiconductor material on said sacrificial region is earned out before said step of growing an epitaxial layer and wherein said step of growing an epitaxial layer comprises the step of growing a multi-crystal region on said nucleus region and growing a single-crystal region on said substrate, and wherein said suspended mass is formed in said multi-crystal region and wherein the process comprises the step of forming electronic components in said single-crystal region.

9. The process according to claim 8 wherein said substrate has a first conductivity type; wherein, before said step of forming a sacrificial region, a step of forming buried conductive regions of a second conductivity type in said substrate is carried out, wherein, at the same time as said step of forming a sacrificial layer, electrically insulating material regions are formed, extending on said buried conductive regions and delimiting therebetween portions of selective contact of said buried conductive regions; and wherein, after said step of growing an epitaxial layer, a step of forming deep contact regions extending from a surface of said epitaxial layer as far as said buried conductive regions to form deep contacts is performed.

10. A method for producing an integrated sensor comprising the steps of:

forming a sacrificial support layer [on] *in* a semiconductor substrate;

forming an epitaxial layer on the sacrificial support layer and on the semiconductor substrate;

depositing a [tungsten layer] *weighting region* on the epitaxial layer;

removing the sacrificial support layer; and forming a movable mass from portions of the epitaxial *layer* and [tungsten layers] *the weighting region* by forming trenches to separate the movable mass from fixed regions of the epitaxial *layer* and [tungsten layers] *weighting region and separated from said substrate by an air gap, the movable mass thereby supported by anchorage zones only at the sides*.

11. The method of claim 10 wherein the step of depositing *a weighting region comprises depositing* a tungsten layer [is performed] before the step of forming a movable mass *to have a shape corresponding to a shape of the movable mass*.

12. The method of claim 10 wherein the step of forming a moveable mass comprises:

forming a protective layer on the [tungsten layer] *weighting region*;

masking a pattern on the protective layer; and etching trenches through the protective *layer*, [tungsten, and] epitaxial [layers] *layer, and the weighting region*.

13. The method of claim 10, further including the steps of: forming electronic components in the epitaxial layer; depositing a dielectric layer over the components; and forming contact openings in the dielectric layer.

*14. A process for manufacturing an accelerometric and gyroscopic integrated sensor, comprising the steps of:*

*forming a sacrificial region in a substrate of semiconductor material;*

*growing an epitaxial layer on said substrate and said sacrificial region; and*

*removing selective portions of said epitaxial layer and said sacrificial region to form a movable mass surrounded at the sides and separated from fixed regions by trenches and separated from said substrate by an air gap, the movable mass supported by anchorage zones only at the sides; and*

*forming a weighting region of a metal at said movable mass.*

*15. The process according to claim 14 wherein said step of forming a weighting region comprises a step of depositing and defining a tungsten layer over said epitaxial layer to have a shape corresponding to a shape of the movable mass.*

*16. A method for producing an integrated sensor comprising the steps of:*

*forming a sacrificial support layer in a semiconductor substrate;*

*forming an epitaxial layer in the sacrificial support layer and on the semiconductor substrate;*

*depositing a metal layer on the epitaxial layer;*

*removing the sacrificial support layer; and*

*forming a movable mass from portions of the epitaxial layer and the metal layer by forming trenches to separate the movable mass from fixed regions of the epitaxial layer and weighting region and separated from said substrate by an air gap, the movable mass thereby supported by anchorage zones only at the sides.*

*17. The process according to claim 16 wherein the step of depositing a metal layer comprises depositing a tungsten layer to have a shape corresponding to a shape of the movable mass.*

*18. A process for manufacturing an accelerometric and gyroscopic integrated sensor, comprising the steps of:*

*forming a sacrificial region on a substrate of semiconductor material;*

*growing an epitaxial layer on said substrate and said sacrificial region;*

*removing selective portions of said epitaxial layer and said sacrificial region to form a movable mass surrounded at the sides and separated from fixed regions by trenches and separated from said substrate by an air gap, the movable mass supported by anchorage zones only at the sides; and*

*forming a weighting region at said movable mass,*

*wherein a step of forming a nucleus region of non-single-crystal semiconductor material on said sacrificial region is carried out before said step of growing an epitaxial layer and wherein said step of growing an epitaxial layer comprises the step of growing a multi-crystal region on said nucleus region and growing a single-crystal region on said substrate, and wherein said suspended mass is formed in said multi-crystal region and wherein the process comprises the step of forming electronic components in said single-crystal region.*

*19. The process according to claim 18 wherein said substrate has a first conductivity type; wherein, before said step of forming a sacrificial region, a step of forming buried conductive regions of a second conductivity type in said substrate is carried out, wherein, at the same time as said step of forming a sacrificial layer, electrically insulating material regions are formed, extending on said buried conductive regions and delimiting therebetween portions of selective contact of said buried conductive regions; and wherein, after said step of growing an epitaxial layer, a step of forming deep contact regions extending from a surface of said epitaxial layer as far as said buried conductive regions to form deep contacts is performed.*

*20. The process of claim 18 wherein forming the weighting region comprises forming the weighting region over the movable mass to have a shape corresponding to a shape of the movable mass.*

* * * * *